United States Patent
Okase et al.

(10) Patent No.: US 6,228,173 B1
(45) Date of Patent: May 8, 2001

(54) SINGLE-SUBSTRATE-HEAT-TREATING APPARATUS FOR SEMICONDUCTOR PROCESS SYSTEM

(75) Inventors: Wataru Okase, Sagamihara; Masaaki Hasei, Tsukui-gun, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/410,024

(22) Filed: Oct. 1, 1999

(30) Foreign Application Priority Data

Oct. 12, 1998 (JP) .................................................. 10-304782
Dec. 11, 1998 (JP) .................................................. 10-375151
Dec. 11, 1998 (JP) .................................................. 10-375152

(51) Int. Cl.$^7$ .......................... C23C 16/455; C23C 16/46; C23C 16/503
(52) U.S. Cl. ............................ 118/719; 118/641; 427/595
(58) Field of Search .................................... 156/345, 643; 118/722, 719, 641; 361/234; 216/71; 279/128; 427/595

(56) References Cited

U.S. PATENT DOCUMENTS

| | | | |
|---|---|---|---|
| 4,687,544 | * | 8/1987 | Bersin .................................. 156/643 |
| 4,689,112 | * | 8/1987 | Bersin .................................. 156/643 |
| 5,138,520 | * | 8/1992 | McMillan et al. .................... 361/311 |
| 5,178,682 | * | 1/1993 | Tsukamoto et al. .................. 118/722 |
| 5,207,437 | * | 5/1993 | Barnes et al. ......................... 279/128 |
| 5,683,537 | * | 11/1997 | Ishii ..................................... 156/345 |
| 5,766,498 | * | 6/1998 | Kojima et al. .......................... 216/71 |
| 5,968,379 | * | 10/1999 | Zhao et al. ....................... 219/121.52 |
| 5,978,202 | * | 11/1999 | Wadensweiler et al. ............. 361/234 |
| 5,997,962 | * | 12/1999 | Ogasawara et al. .................. 427/535 |
| 6,042,687 | * | 3/2000 | Singh et al. ........................... 156/345 |

* cited by examiner

Primary Examiner—Gregory Mills
Assistant Examiner—Rudy Zervigon
(74) Attorney, Agent, or Firm—Oblon, Spivak, McClelland, Maier & Neustadt, P.C.

(57) ABSTRACT

A heat-treating apparatus is arranged to perform a reforming process and a crystallizing process for tantalum oxide deposited on a semiconductor wafer. The apparatus includes a worktable with a heater incorporated therein. Under the worktable, there is a heat-compensating member formed of a thin plate and having a counter surface facing the bottom surface of the worktable along the periphery. The counter surface is formed of a mirror surface having a surface roughness of Rmax=25 $\mu$m or less. Heat rays and radiant heat are reflected by the counter surface and applied to the periphery of the worktable, thereby compensating the periphery for heat loss.

5 Claims, 11 Drawing Sheets

SINGLE-SUBSTRATE-HEAT-TREATING APPARATUS FOR SEMICONDUCTOR PROCESS SYSTEM

BACKGROUND OF THE INVENTION

1. Field of the Invention

The present invention relates to a single-substrate-heat-treating apparatus for a semiconductor process system, and particularly, to a single-substrate-heat-treating apparatus for performing a reforming process for removing inorganic impurities contained in a thin film formed on a target substrate and for performing a crystallizing process for crystallizing the thin film. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD (Liquid Crystal Display) substrate, by forming semiconductor layers, insulating layers, and conductive layers in predetermined patterns on the target substrate.

2. Discussion of the Background

In the manufacturing process of a semiconductor device, a film forming process and a pattern etching process are repeatedly applied to a semiconductor wafer. The requirements for the film forming process have become stricter in recent years in accordance with increases in the density and in the degree of integration of the semiconductor devices. For example, a further decrease in thickness and higher insulating properties are required even for a very thin insulating film such as an insulating film included in a capacitor or a gate insulating film.

A silicon oxide film or a silicon nitride film is widely used as such an insulating film. However, a metal oxide film such as a tantalum oxide ($Ta_2O_5$) film has come to be used in recent years as an insulating film exhibiting further improved insulating properties. Such a metal oxide film can be formed by an MOCVD (Metal Organic Chemical Vapor Deposition) method, in which an organometallic compound is gasified for deposition of the metal. The insulating properties of the metal oxide film can be further improved by applying a reforming process to the surface of the metal oxide film after deposition.

In the process of forming a tantalum oxide film, at first, an amorphous tantalum oxide film is deposited on a semiconductor wafer, using a CVD apparatus. Then, the wafer is transferred into a heat-treating apparatus for reformation, where the amorphous tantalum oxide film is subjected to a reforming process. Then, the wafer is transferred into a heat-treating apparatus for crystallization, where the tantalum oxide film is crystallized by means of annealing.

In the reforming process, the wafer having the tantalum oxide film formed thereon is put under an atmosphere of a reduced-pressure containing ozone. Ozone is irradiated with ultraviolet rays emitted from a mercury lamp so as to generate active oxygen atoms. The organic impurities having C—C bonds, etc. and contained in the tantalum oxide film are decomposed by the active oxygen atoms so as to be removed from the tantalum oxide film. As a result, the insulating properties of the tantalum oxide film are improved. The reforming process is carried out at a temperature lower than the crystallizing temperature, e.g., at about 425° C., in order to allow the tantalum oxide film to maintain its amorphous state.

In the crystallizing process, the tantalum oxide film is heated within the heat-treating apparatus in the presence of $O_2$ gas to a temperature higher than the crystallizing temperature, e.g., to about 700° C. By this annealing process, the tantalum oxide film is crystallized and the density thereof is increased in the molecule level, with the result that the insulating properties of the tantalum oxide film are further improved.

Jpn. Pat. Appln. KOKAI Publication No. 10-79377 (U.S. pat. appln. Ser. No. 08/889,590) discloses a cluster-tool-type film forming system in which a CVD apparatus, a reforming apparatus and a crystallizing apparatus are connected to each other via a common transfer chamber. The cluster-tool-type film forming system allows the through-put to be increased.

The heat-treating apparatus for performing the reforming or crystallizing process is constituted as a single-substrate-treating type in which wafers are treated or processed one by one in a process chamber. The process chamber of the single-substrate-heat-treating apparatus has a side wall used in a cold wall state, and the periphery of a worktable tends to have a temperature lower than the center of the worktable, because the periphery of the worktable is closer to the side wall than the center of the worktable is, and radiates heat more than the center of the worktable does. As a result, the planar uniformity of the temperature on a wafer during a heat-treatment is lowered, and thus the planar uniformity of the process is also lowered.

Incidentally, a heat-treating apparatus of the type in which a process gas is supplied from a shower type, generally causes the process gas to be spouted downward from the shower head, flow diagonally downward and spread to the periphery of the wafer. Further, the process gas tends to increase its flowing speed at the periphery of the wafer and thus stays there for a shorter period of time. As a result, the density of the process gas becomes thin on the center and periphery of the wafer, and thus the processed amount on the center and periphery of the wafer is less than that on the intermediate portion of the wafer.

The above described problem is more unacceptable, with an increase in wafer size from 6 through 8 to 12 inches. Further, the above describe problem is common to all the heat-treatment including film deposition process, diffusion process, and the like, as well as the reforming process and the crystallizing process.

BRIEF SUMMARY OF THE INVENTION

An object of the present invention is to provide a single-substrate-heat-treating apparatus in which the planer uniformity of the temperature on a target substrate is improved by a simple structural change, so that a process can be performed with a high planer uniformity.

Another object of the present invention is to provide a single-substrate-heat-treating apparatus in which the flow of a process gas in a process chamber is improved by a simple structural change, so that a process can be performed with a high planer uniformity.

According to a first aspect of the present invention, there is provided a single-substrate-heat-treating apparatus for a semiconductor process system, comprising:

an airtight process chamber;

a worktable arranged within the process chamber and having a top surface configured to place a target substrate thereon;

an exhaust mechanism configured to exhaust the process chamber;

a supply mechanism configured to supply a process gas into the process chamber;

a heating mechanism configured to heat the target substrate placed on the worktable; and a heat-compensating member having a counter surface facing a bottom surface of the worktable along a periphery of the bottom surface.

According to a second aspect of the present invention, there is provided a single-substrate-heat-treating apparatus for a semiconductor process system, comprising:

an airtight process chamber;

a worktable arranged within the process chamber and having a top surface configured to place a target substrate thereon;

an exhaust mechanism configured to exhaust the process chamber;

a supply mechanism configured to supply a process gas into the process chamber; and a heating mechanism configured to heat the target substrate placed on the worktable;

wherein the supply mechanism comprises a shower head including an outside pipe having a ring shape with a diameter larger than a diameter of the target substrate, and inside pipes connected to an inside of the outside pipe and combined to form a lattice, and wherein the inside pipes are provided with first spurting holes for spouting the process gas downward, and part of the inside pipes defining a central opening of the shower head are provided with second spurting holes for spouting the process gas inward in a horizontal direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention, in which.

DETAILED DESCRIPTION OF THE INVENTION

Figure 1:
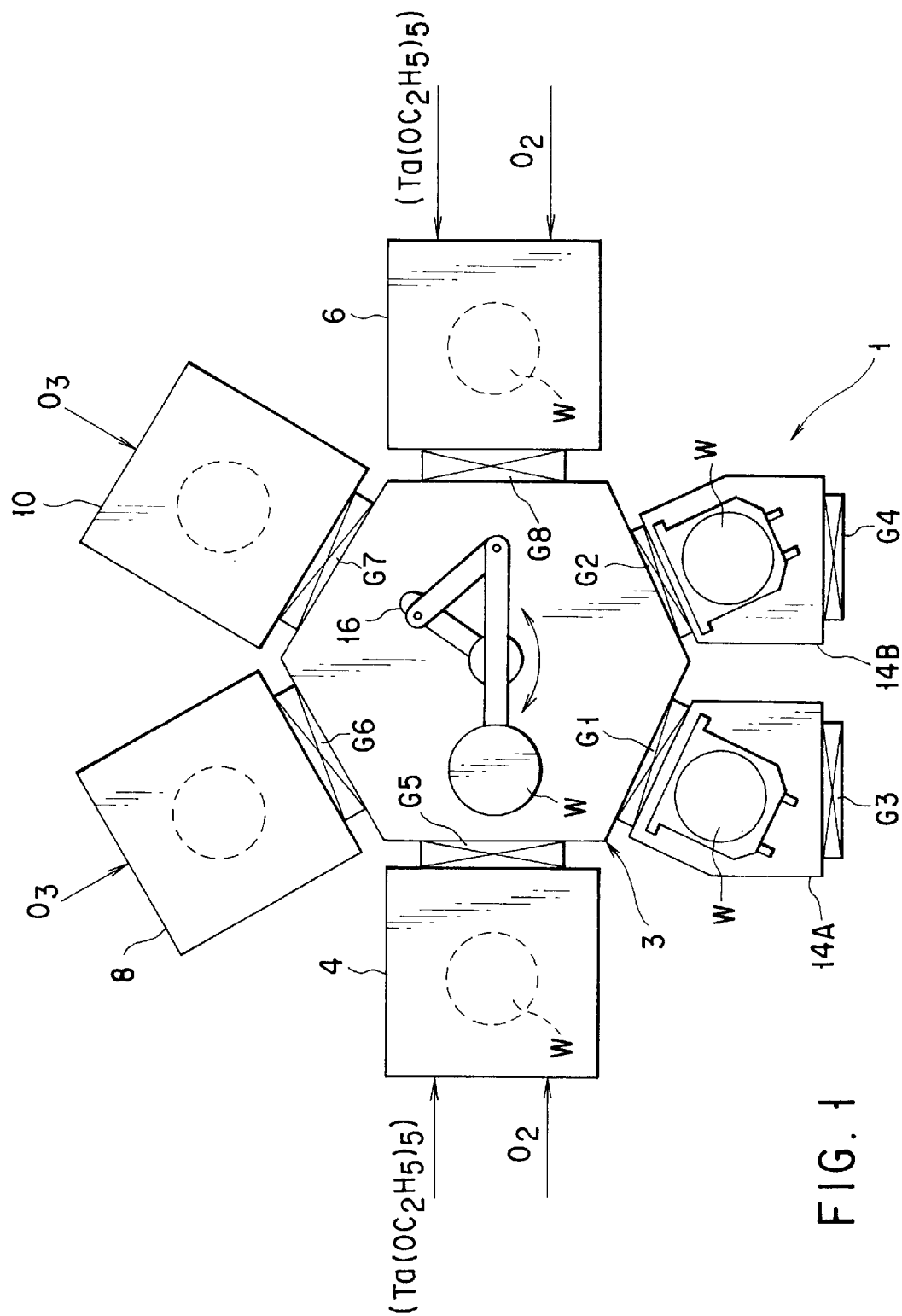
FIG. 1 is a plan view schematically showing the main part of a cluster-tool-type film forming system according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a plan view schematically showing the main part of a cluster-tool-type film forming system according to an embodiment of the present invention.

In the film forming system 1 shown in FIG. 1, two CVD apparatuses 4 and 6, and two heat-treating apparatuses 8 and 10 are connected to a common transfer chamber 3. Further, two cassette chambers 14A and 14B are also connected to the common transfer chamber 3 for improving the wafer transfer efficiency. A wafer is transferred among these apparatuses 4, 6, 8, and 10, and the cassette chambers 14A and 14B through the common transfer chamber 3. For transferring the wafer, an arm mechanism 16 consisting of a multi-joint arm that can be extended, contracted and swung is arranged within the common transfer chamber 3.

The common transfer chamber 3 is connected to the cassette chamber 14A via a gate valve G1 and to the cassette chamber 14B via a gate valve G2. The cassette chambers 14A and 14B are provided with gate doors G3 and G4, respectively, that can be opened or closed to allow the inner spaces of the cassette chambers 14A and 14B to communicate with the outer working environment. Further, the common transfer chamber 3 is connected to the CVD apparatuses 4 and 6, and the heat-treating apparatuses 8 and 10 via gate valves G5, G6, G7 and G8, respectively.

Each of the common transfer chamber 3 and the cassette chambers 14A and 14B is of an airtight structure. The cassette chambers 14A and 14B constitute the wafer load/ unload port of the entire film forming system. A cassette C housing a plurality of semiconductor wafers is transferred into and taken out of each of the cassette chambers 14A and 14B through the gate doors G3 and G4 that are opened. Each of the cassette chambers 14A and 14B is provided with a cassette stage (not shown) that can be moved in a vertical direction and swung. Further, the cassette chambers 14A and 14B can be vacuum-exhausted with the cassette C housed therein.

Each of the CVD apparatuses 4 and 6 is used for forming an amorphous metal oxide film, e.g., a tantalum oxide film, on a target substrate, e.g., a semi-conductor wafer, under a vacuum atmosphere containing an evaporated metal oxide film raw material and an oxidizing gas. Each of the heat-treating apparatuses 8 and 10 is used for subjecting a metal oxide film successively to a reforming process by exposing the metal oxide film to active oxygen atoms under a vacuum atmosphere, and to a crystallizing process by heating the metal oxide film to a temperature higher than the crystallizing temperature.

Each of the apparatuses 4, 6, 8, and 10 and the cassette chambers 14A and 14B is connected to a gas supply mechanism (not shown) for purging the inner spaces with an inert gas, e.g., $N_2$ gas, and to a vacuum exhaust mechanism (not shown) for vacuum-exhausting the inner spaces. The $N_2$ gas supply to these apparatuses 4, 6, 8, and 10 and the cassette chambers 14A and 14B, and the vacuum exhaust of these apparatuses 4, 6, 8, and 10 and the cassette chambers 14A and 14B can be controlled independently of each other.

Figure 2:
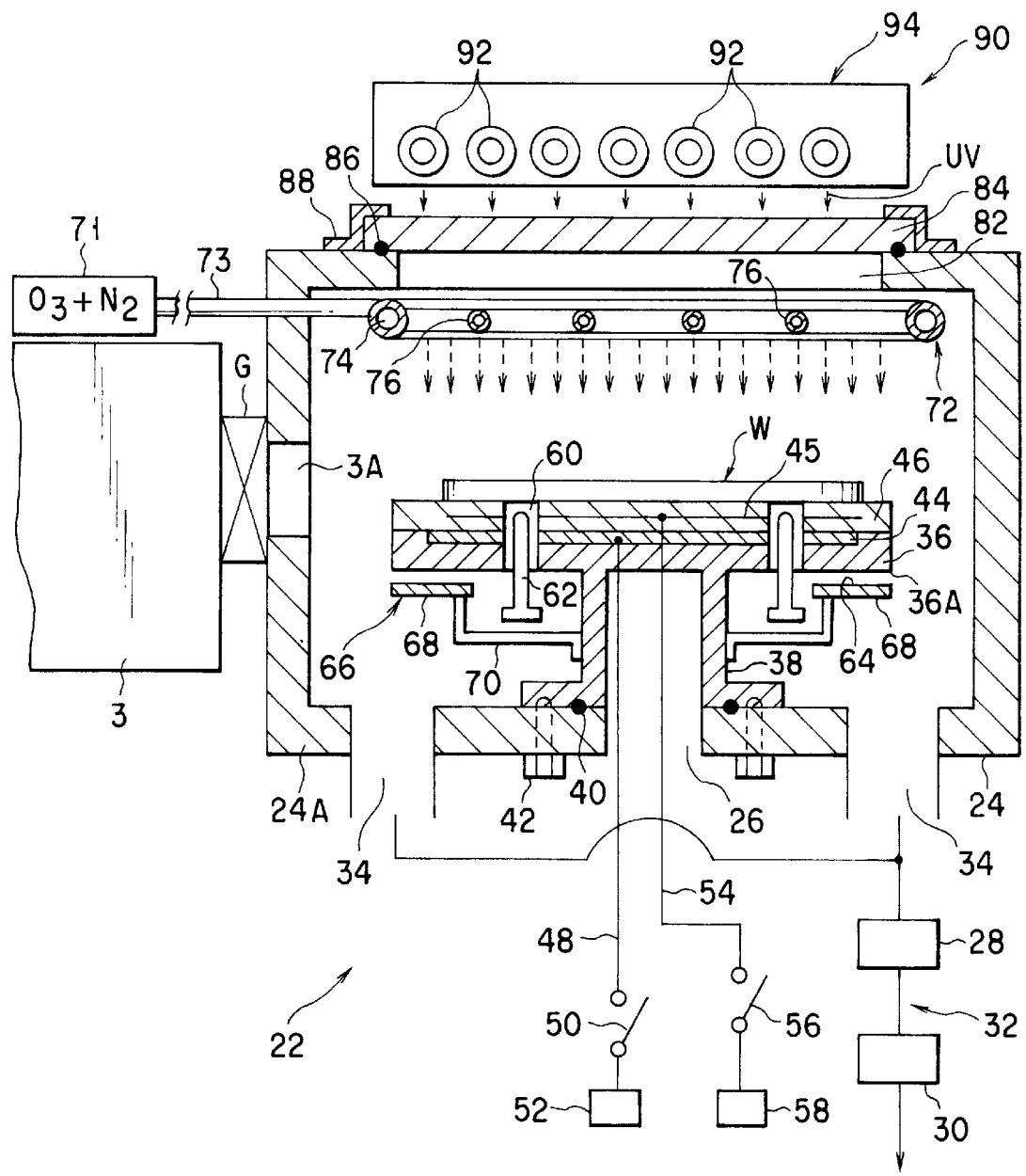
FIG. 2 is a constitutional view schematically showing the main part of a heat-treating apparatus according to an embodiment of the present invention, which may be used in the film forming system shown in FIG. 1.

FIG. 2 is a constitutional view schematically showing the main part of a heat-treating apparatus 22 according to an embodiment of the present invention. The apparatus 22 may be used as each of the heat-treating apparatuses 8 and 10 in the film forming system shown in FIG. 1.

As shown in FIG. 2, the heat-treating apparatus 22 includes a cylindrical process chamber 24 made of aluminum. A guide hole 26 for inserting power supply lines is formed at the center of the bottom 24A of the process chamber 24. A plurality of, e.g., four, exhaust ports 34 are equidistantly formed on a circle in the periphery of the bottom 24A of the process chamber 24. The exhaust ports 34 are connected to a common vacuum exhaust mechanism 32 including vacuum pumps, such as a turbo-molecular pump 28 and a dray pump 30, so as to make it possible to vacuum-exhaust the inner space of the process chamber 24.

A wafer-transfer port 3A is formed in the side wall of the process chamber 24. The common transfer chamber 3, which is formed of a load lock chamber that can be vacuum-exhausted, is connected to the port 3A with a gate valve G interposed therebetween. The semiconductor wafer W is transferred into the process chamber 24 through the common transfer chamber 3. As described before, an $N_2$ gas supply mechanism (not shown) for the purging purpose is connected to each of the process chamber 24 and the common transfer chamber 3.

A worktable 36 made of a nonconductive material, e.g., alumina, and having a circular disk-like shape is arranged within the process chamber 24. A substantially circular semiconductor wafer W as a target substrate can be placed on the worktable 36. A leg portion 38 formed of a hollow cylinder is integratedly formed at the center of the bottom of the worktable 36 and extends downward. The lower end of the leg portion 38 is arranged to surround the guide hole 26 in the bottom 24A of the process chamber 24 and is airtightly connected and fixed to the bottom 24A by bolts 42 with a seal member 40, such as an O-ring, interposed therebetween.

Consequently, the inside of the hollow leg portion 38 communicates with the outside of the process chamber 24, and is airtightly isolated from the inside of the process chamber 24.

A resistance heating body 44 made of carbon and coated with, for example, SiC is embedded in the worktable 36 so as to heat the semiconductor wafer W placed thereon to a desired temperature. A thin electrostatic chuck 46 made of a ceramic material is arranged on the worktable 36. An electrode 45 formed of a copper plate or the like is buried in the electrostatic chuck 46. The wafer W is attracted and held on top of the worktable 36 by Coulomb's force generated by the electrostatic chuck 46.

A backside gas, such as He gas, is supplied between the bottom of the wafer W and the surface of the electrostatic chuck 46, so that the heat conductivity to the wafer W is improved, and film deposition on the bottom of the wafer W is prevented. In place of the electrostatic chuck 46, a mechanical clamp may be employed.

The resistance heating body 44 is connected to a lead line 48 for supplying electricity, which is insulated from the members around it. The lead line 48 is led out to the outside of the process chamber 24 through the cylindrical leg portion 38 and the guide hole 26, without being exposed to the inside of the process chamber 24, and is connected to a power supply section 52 though a switch 50. The electrode 45 of the electrostatic chuck 46 is connected to a lead line 54 for supplying electricity, which is insulated from the members around it. The lead line 54 is lead out to the outside of the process chamber 24 through the cylindrical leg portion 38 and the guide hole 26, without being exposed to the inside of the process chamber 24, and is connected to a high-voltage DC power supply 58 though a switch 56.

A plurality of holes 60 are formed at positions on the periphery of the worktable 36 to penetrate the worktable 36, and lifter pins 62 are arranged in the holes 60 to be vertically movable. When the wafer W is transferred, the wafer W is moved in a vertical direction by an elevating mechanism (not shown) through the lifter pins 52. Generally, three lifter pins 62 are arranged to correspond to the periphery of the wafer W.

Figure 4:
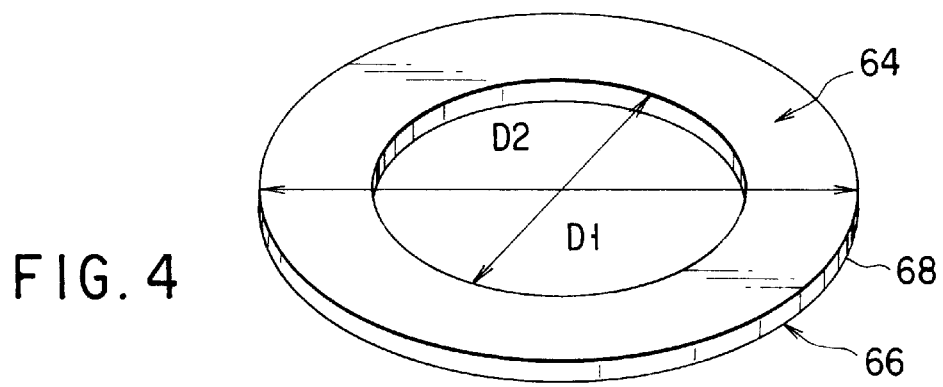
FIG. 4 is a perspective view showing a heat-compensating member used in the apparatus shown in FIG. 2.

Below the worktable 36, there is a heat-compensating member 66 including a counter surface 64 of a ring shape which faces the bottom surface 36A of the worktable 36 along the periphery of the bottom surface 36A. Specifically, as shown in FIG. 4, the heat-compensating member 66 includes a thin ring plate 68 made of a metal, such as stainless steel, and having a thickness of from 2 to 3 mm. The thin plate 68 is fixed to the leg portion 38 by a support frame 70 of, e.g., stainless steel. In place of a metal, e.g., stainless steel, the thin plate 68 may be formed of another heat-resistant and corrosion-resistant material, such as a ceramic, e.g., $Al_2O_3$, an opaque quartz, and the like.

The distance between the top surface, i.e., the counter surface 64, of the thin plate and the bottom surface 36A of the worktable 36 is set to be less than 100 mm, preferably from 1 to 10 mm. The counter surface 64 is finished as a mirror surface having a surface roughness of Rmax (maximum height)=25 μm or less, preferably Rmax=from 0.8 to 6.3 μm. Heat rays and radiant heat are reflected by the mirror-like counter surface 64 and applied to the periphery of the worktable 36, thereby compensating the periphery for heat loss.

Figure 5:
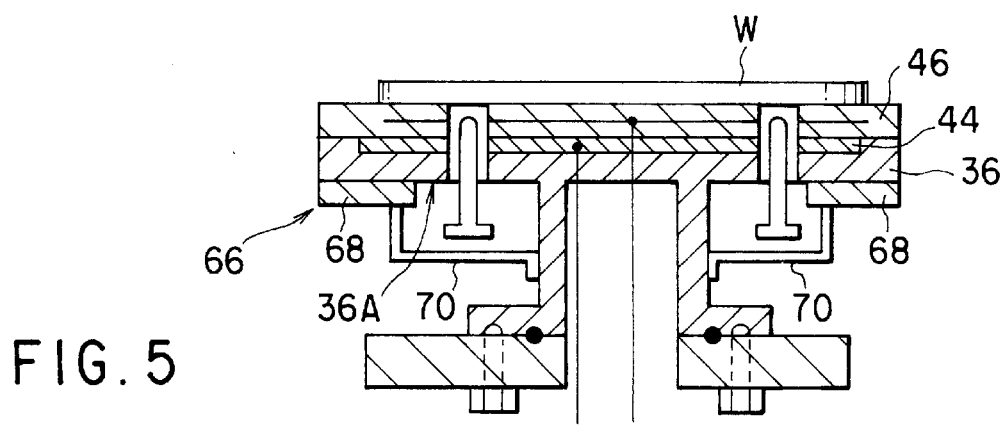
FIG. 5 is a cross-sectional view showing the relationship between a worktable and a heat-compensating member in a modification of the apparatus shown in FIG. 2.

As shown in FIG. 5, the counter surface 64 of the thin plate 68 may be arranged in contact with the bottom surface 36A of the worktable 36. Even in this case, small microscopic gaps are formed between the surfaces 64 and 36A of the thin plate 68 and the worktable 36 which have been fabricated independently of each other. Accordingly, heat emitted from the periphery of the worktable 36 is reflected by the counter surface 64, thereby compensating the periphery for heat loss.

The counter surface 64 has an inner diameter D1 which is larger than the radius of the worktable 36 and smaller than the diameter of the worktable 36, and an outer diameter D2 which is not less than the diameter of the worktable 36. In other words, the counter surface 64 has an inner diameter D1 which is smaller than the diameter of the wafer W, and an outer diameter D2 which is larger than the diameter of the wafer W. With these dimensions, the periphery of the worktable 36 is efficiently supplied with heat and is compensated for heat loss. Specifically, where the diameter of the worktable is set at 26 cm to correspond to 8-inch wafers, the inner and outer diameters D1 and D2 are set at about 17 cm and 26 cm, respectively.

Figure 3:
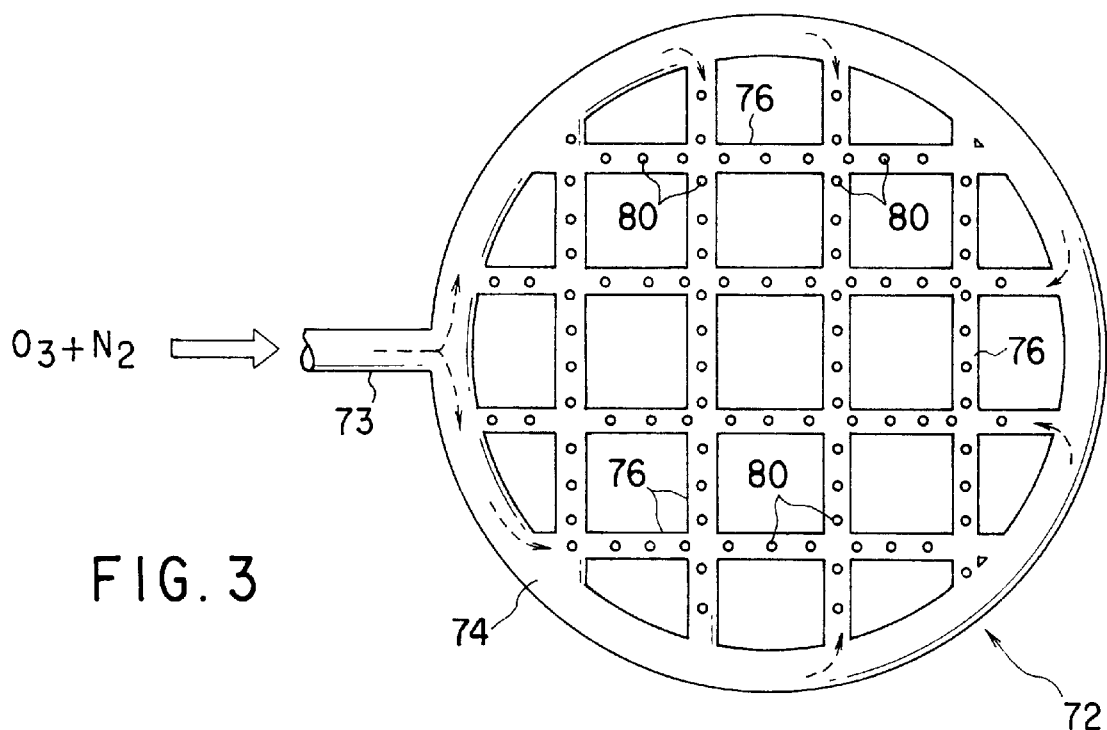
FIG. 3 is a plan view showing a shower head used in the apparatus shown in FIG. 2.

A shower head 72, made of a material, such as quartz, which allows ultraviolet rays to pass through by 90% or more (substantially transparent), is arranged near the ceiling of the process chamber 24. As shown in FIG. 3, the shower head 72 includes an outside pipe 74 connected to a line pipe 73 and having a ring shape with a diameter larger than the diameter of the wafer W, and inside pipes 76 connected to the inside of the outside pipe 74 and consisting of four vertical pipes and four horizontal pipes combined to form a lattice. The tube-inner diameters of the outside pipe 74 and the inside pipes 76 are set at about 16 mm and 4.35 mm, respectively. A large number of gas spurting holes 80 each having a diameter of about 0.3 to 0.5 mm are equidistantly formed on the lower side of the inside pipes 76, for spouting a process gas downward.

It is desirable for the projected surface area of the inside pipes 76 on the wafer W placed on the worktable 36 to be smaller than 20% of the area of the wafer surface. In this case, the wafer surface can be irradiated directly with ultraviolet rays UV, which are to be described later, running through the clearances of the lattice of the inside pipes 76.

The line pipe 73 for introducing a process gas into the shower head 72 airtightly extends through the side wall of the process chamber so as to be led to the outside. The line pipe 73 is connected to a gas source 71 via a mass flow controller (not shown). A process gas such as ozone gas is introduced into the shower head 72 through the line pipe 73.

A circular aperture 82 set larger than the wafer diameter is formed in a ceiling of the process chamber 24. A circular transmitting window 84 made of a material transparent to ultraviolet rays, such as quartz, is airtightly mounted in the aperture 82 by a fixing frame 88 using a seal member 86 such as an O-ring. The transmitting window 84 has a thickness of, for example, 20 mm to enable the window 84 to withstand atmospheric pressure.

An UV radiating mechanism 90 for radiating ultraviolet rays toward the process chamber 24 is arranged above the transmitting window 84. The process gas of ozone is irradiated with the ultraviolet rays so as to generate active oxygen atoms.

To be more specific, the UV radiating mechanism 90 includes a plurality of, e.g., seven, cylindrical ultraviolet lamps 92. The ultraviolet lamps 92 are arrayed outside the quartz window 84 to face the mount surface of the worktable 36 in parallel thereto. The number of lamps 92 may be increased to attain the necessary intensity of ultraviolet rays. Each of the ultraviolet lamps 92 used may be, for example, a cold-cathode ray tube, which emits a lot of ultraviolet rays mainly having a wavelength of 254 nm, with a low power of about 20 W.

All the ultraviolet lamps 92 are covered with a casing 94 having a dome-shaped ceiling. The dome-shaped ceiling is formed as a light reflector for reflecting downward ultraviolet rays which have been radiated upward from the lamps 92.

An explanation will be given as to how to perform heat treatments by using the apparatus shown in FIG. 2.

First, a semiconductor wafer W having a metal oxide film, such as a tantalum oxide ($Ta_2O_5$) film, formed thereon as an insulating film is introduced from the common transfer chamber or load lock chamber 3 through the port 3A into the process chamber 24 in a vacuum condition. Then, the wafer W is placed on the worktable 36 and is attracted and held on the worktable 36 by Coulomb's force of the electrostatic chuck 46.

The wafer W is maintained at a predetermined process temperature by the resistance heating body 44. Also, a predetermined process pressure is maintained within the process chamber 24 by supplying a process gas containing ozone into the process chamber 24 through the shower head 72 while vacuum-exhausting the process chamber 24. Under this condition, a reforming process and a crystallizing process are started as described previously with reference to the film forming system shown in FIG. 1.

The process gas containing ozone introduced into the shower head 72 flows first through the outside ring pipe 74 and, then, into the inside pipes 76. Then, the process gas is supplied into the process chamber 24 through a large number of the spurting holes 80 made in the inside pipes 76. This particular arrangement makes it possible to supply the process gas uniformly to the wafer surface.

At the same time, a large amount of ultraviolet rays UV are emitted from the ultraviolet lamps 92. The ultraviolet rays UV are directly or indirectly transmitted through the transmitting window 84 made of quartz, while part of them are reflected by the reflector of the casing 94, so as to enter the process chamber 24 maintained at a predetermined vacuum pressure. Further, the ultraviolet rays UV pass through the shower head 72 made of quartz so that the process gas containing ozone as a main component is irradiated with the ultraviolet rays within the process chamber 24.

Ozone is irradiated with the ultraviolet rays UV and generates a large amount of active oxygen atoms. The active oxygen atoms act on the metal oxide film and dissociate organic impurities such as C—C bonds and hydrocarbons contained in the metal oxide film so as to reform the metal oxide film. Within the heat process chamber 24, the wafer W having the tantalum oxide film formed thereon is heated under an atmosphere including ultraviolet rays and ozone to a low temperature, such as 450° C., to perform a reforming process. Then, the wafer W is heated to a temperature not lower than the crystallizing temperature of tantalum oxide, followed by lowering the temperature in 60 seconds. As a result, reforming and crystallizing processes of the tantalum oxide film are performed successively.

Since the inner space of the process chamber 24 is held at a vacuum or reduced pressure, the probability of collision of the generated active oxygen atoms against gaseous atoms or gaseous molecules is very low. In addition, since the ultraviolet rays UV are less likely to be absorbed by gaseous molecules, the density of the active oxygen atoms is increased so as to perform the process promptly. By this process, the insulating properties of the metal oxide film can be rapidly markedly improved.

The process pressure should be set to fall within a range of 1 to 600 Torr, e.g., at about 30 Torr. Where the process pressure does not fall within the range noted above, the heat process proceeds slowly or cannot be performed sufficiently, with the result that the insulation breakdown voltage of the metal oxide film is lowered. The process temperature of the reforming process should be set to fall within a range of 320 to 700° C., e.g., at about 450° C. Where the wafer temperature is lower than 320° C., the insulation breakdown voltage of the metal oxide film is insufficient. Where the wafer temperature is higher than 700° C., the metal oxide film is crystallized so as to hinder a sufficient progress of the reformation. On the other hand, the process temperature of the crystallizing process should be set to fall within a range of 700 to 800° C., e.g., 750° C.

When heat treatments are performed for the reforming and crystallizing processes, the side wall of the process chamber 24 is in a cold wall state, and the periphery of the worktable 36 close to the side wall loses temperature more than the center of the worktable 36 does. Consequently, the periphery of the worktable 36 tends to have a temperature lower than that of the center of the worktable 36.

However, in the apparatus according to the present invention, the heat-compensating member 66 formed of, e.g., the stainless steel thin plate 68 is arranged to correspond to the periphery of the bottom of the worktable 36. Heat rays and radiant heat discharged from the worktable 36 are reflected by the counter surface 64 and returned to the worktable 36. Besides, the thin plate 68 is heated itself, and radiant heat from the thin plate 68 is applied to the worktable 36. As a result, the periphery of the worktable 36 is thermally compensated so that the planar uniformity of the wafer temperature is improved. Where the counter surface 64 of the thin plate 68 is finished as a mirror surface, heat rays are efficiently reflected. As a result, the periphery of the worktable 36 is supplied with an increased amount of heat so that the planar uniformity of the wafer temperature is further improved.

As shown in FIG. 5, the thin plate 68 may be arranged in contact with the periphery of the bottom of the worktable 36, thereby also attaining the above described effects. In this case, the thin plate 68 may have a thickness of 2 to 10 mm to have a larger heat capacity, so that the heat supply due to heat conduction is increased.

[Experiment 1]

A comparative experiment was performed in terms of the temperature on a worktable, between an apparatus provided with the heat-compensating member 66 shown in FIG. 2 according the present invention, and a conventional apparatus provided with no heat-compensating member. In this experiment, the diameter of a wafer W was set at 200 mm, the diameter of the worktable 36 at 260 mm, the inner and outer diameters D1 and D2 of the thin plate 68 at 160 mm and 260 mm, respectively, and the distance between the counter surface 64 and the bottom surface 36A of the worktable 36 at 2 to 3 mm. The temperature of the worktable was set at 445° C. and the pressure in the process chamber 24 at 30 Torr. The temperature of the wafer was measured at the central point and at four points (upper, lower, left and right points) on the periphery.

Figure 6:
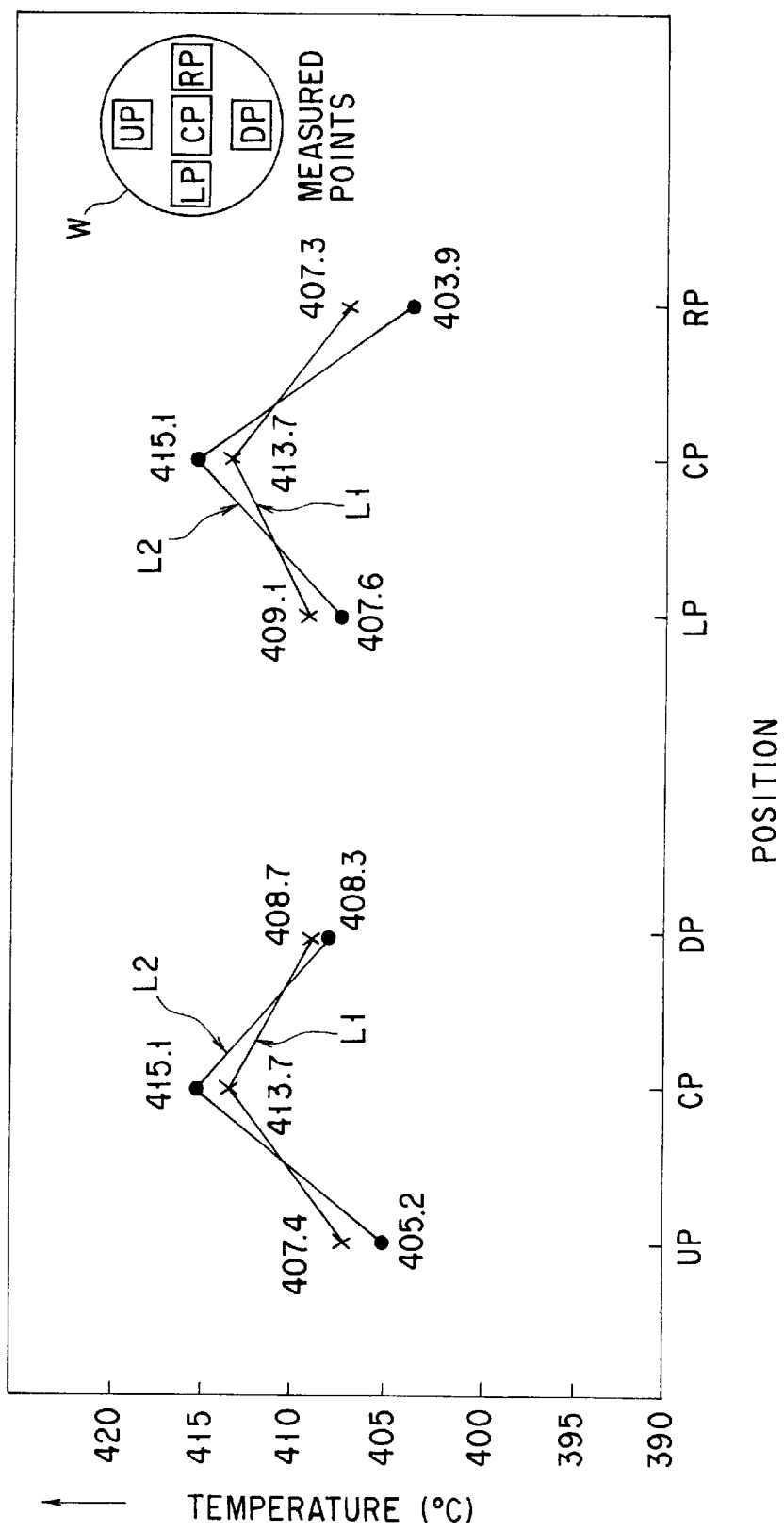
FIG. 6 is a graph showing the result of a comparative experiment in terms of the temperature on a worktable, between the apparatus shown in FIG. 2 and a conventional apparatus having no heat-compensating member.

FIG. 6 is a graph showing the result of the comparative experiment. In FIG. 6, measured points (central point DP, upper point UP, lower point DP, left point LP, and right point RP) are schematically shown. In FIG. 6, lines L1 and L2 denote the result of the apparatus of the present invention and the conventional apparatus, respectively. As shown in this graph, the conventional apparatus resulted in a thermal distribution having a temperature difference as large as about 11° C. at most between the central point CP and the peripheral portion (upper point UP, lower point DP, left point LP, and right point RP). On the other hand, the apparatus of the present invention resulted in a thermal distribution having a temperature difference as small as about 6° C. at most. According to a calculation, the conventional apparatus resulted in a planer uniformity of the wafer temperature with a large difference of ±5.6° C., while the apparatus of the present invention resulted in an improved planer uniformity of the wafer temperature with a small difference of ±3.2° C.

Figure 7:
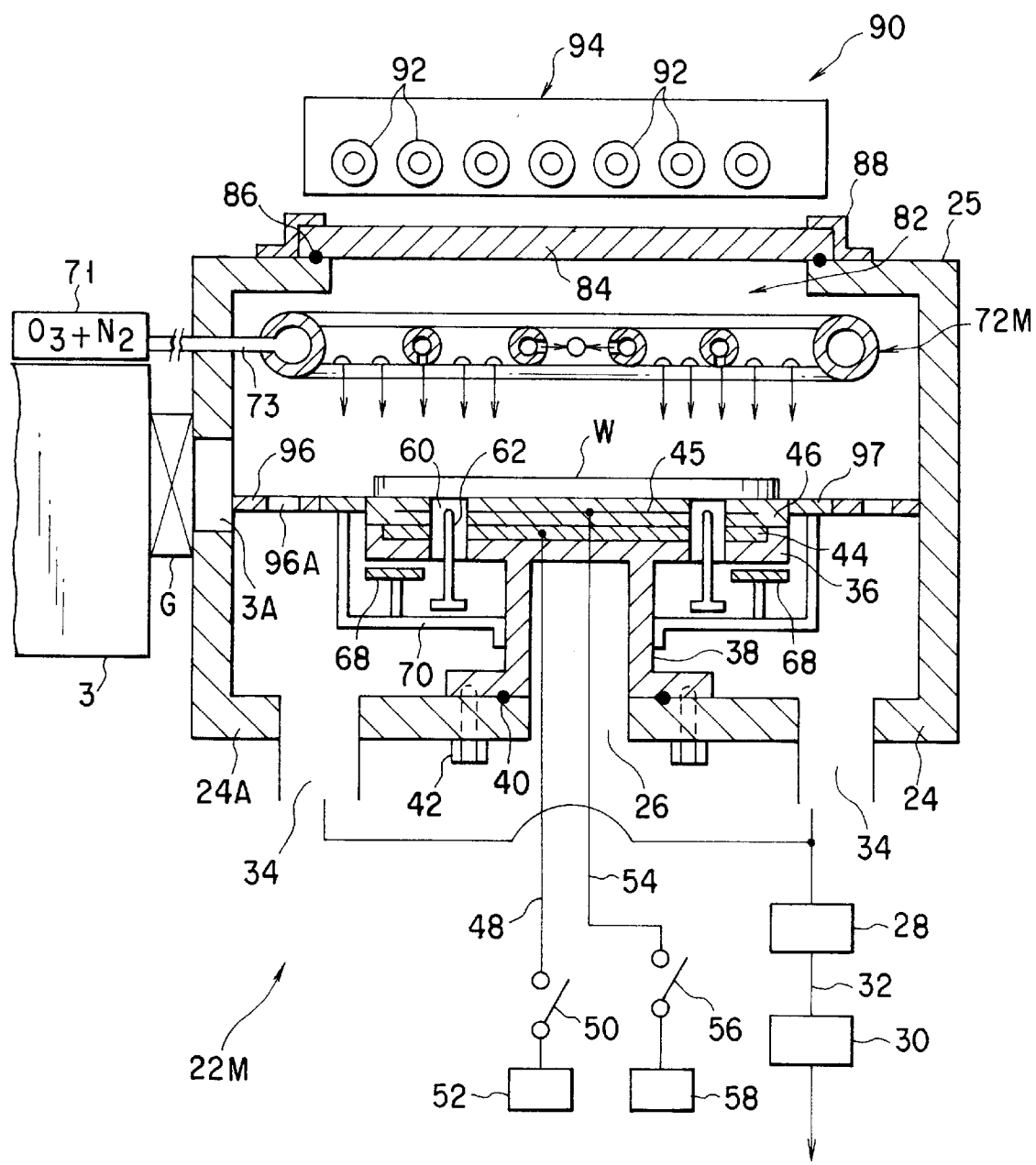
FIG. 7 is a constitutional view schematically showing the main part of a heat-treating apparatus according to another embodiment of the present invention, which may be used in the film forming system shown in FIG. 1.

FIG. 7 is a constitutional view schematically showing the main part of a heat-treating apparatus 22M according to another embodiment of the present invention. The apparatus 22M may be used as each of the heat-treating apparatuses 8 and 10 in the film forming system shown in FIG. 1.

Figure 8:
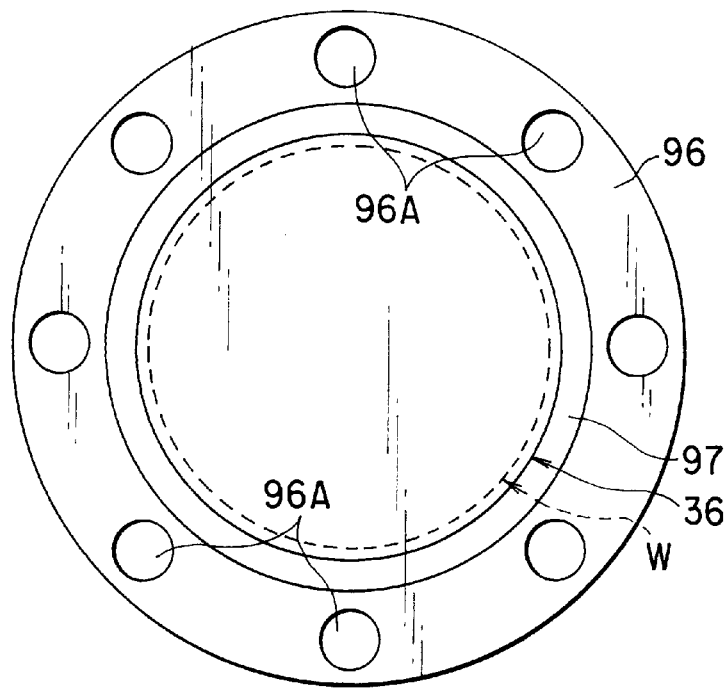
FIG. 8 is a plan view showing a worktable, a rectifying plate, and a seal plate used in the apparatus shown in FIG. 7.

The heat-treating apparatus 22M includes, in addition to the structure of the apparatus 22 shown in FIG. 2, a rectifying plate 96 arranged around a worktable 36 to partition the space in the process chamber 24. As shown in FIG. 8, the rectifying plate 96 is a ring plate made of a corrosion-resistant material, such as stainless steel, and provided with a number of circular through holes 96A arrayed in the angular direction at certain intervals. The rectifying plate 96 is connected at its outer periphery to the inner surface of the process chamber 24, so that it is fixed at a predetermined position. The atmosphere in the process field accommodating the wafer W is substantially uniformly vacuum-exhausted through the holes 96A.

A seal plate 97 is arranged to airtightly seal a ring portion having a width of about 10 mm between the worktable 36 and the rectifying plate 96. The seal plate 97 is also a ring plate made of a corrosion-resistant material, such as stainless steel. The seal plate 97 is supported along with a thin plate 68 of a heat-compensating member 66 by a leg portion 38 through a common stainless steel support frame 70. The seal plate 97 may be integrally connected to the rectifying plate 96, instead of being attached to the support frame 70.

Figure 9:
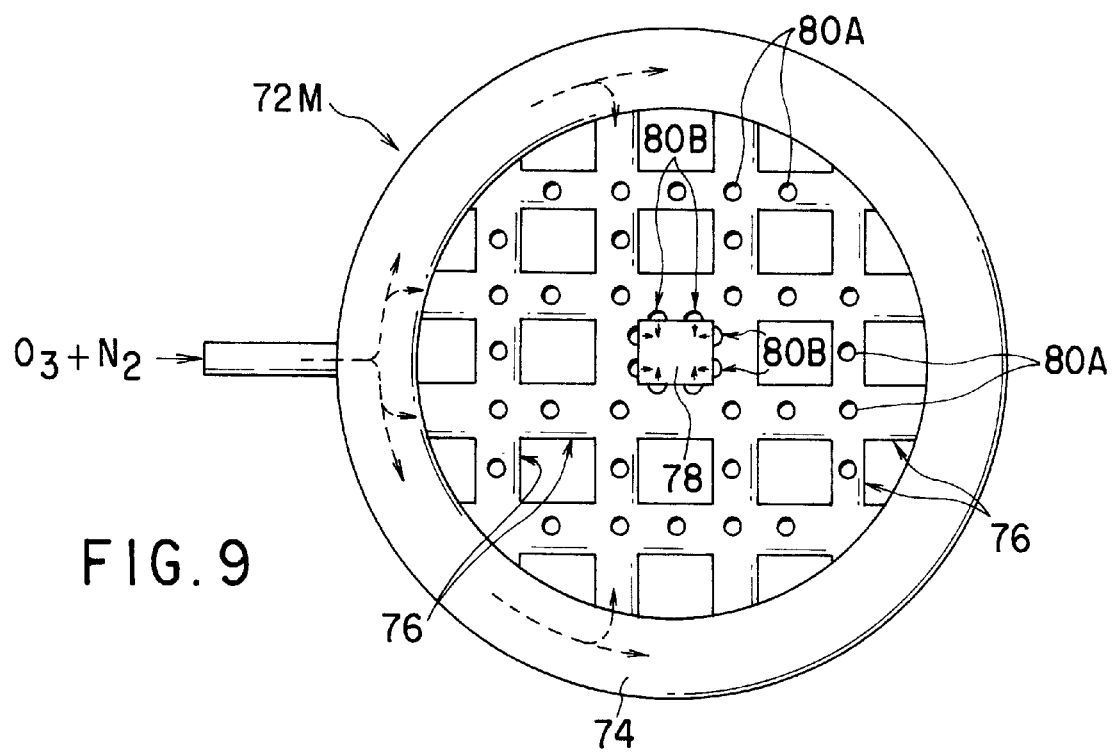
FIG. 9 is a plan view showing a shower head used in the apparatus shown in FIG. 7.

Further, the heat-treating apparatus 22M includes a shower head 72M different from the shower head 72 shown in FIG. 3. As shown in FIG. 9, the shower head 72M includes an outside pipe 74 connected to a line pipe 73 and having a ring shape with a diameter larger than the diameter of the wafer W, and inside pipes 76 connected to the inside of the outside pipe 74 and consisting of four vertical pipes and four horizontal pipes combined to form a lattice. The tube-inner diameters of the outside pipe 74 and the inside pipes 76 are set at about 16 mm and 4.35 mm, respectively.

A large number of first spurting holes BOA are equidistantly formed on the lower side of that part of the inside pipes 76 except for the part defining a rectangular opening 78 at the center of the shower head 72M, for spouting a process gas downward. Second spurting holes 80B are formed on the side, facing the center, of the part of the inside pipes 76 defining the rectangular opening 78 at the center of the shower head 72M, for spouting the process gas in a horizontal direction toward the center. The spouting holes 80A and 80B each have a diameter of about 0.3 to 0.5 mm. The supply amount of the process gas at the center of the wafer is increased as compared with the shower head 72 shown in FIG. 3, by the part of the process gas being spouted in the horizontal directions toward the center.

Figure 10:
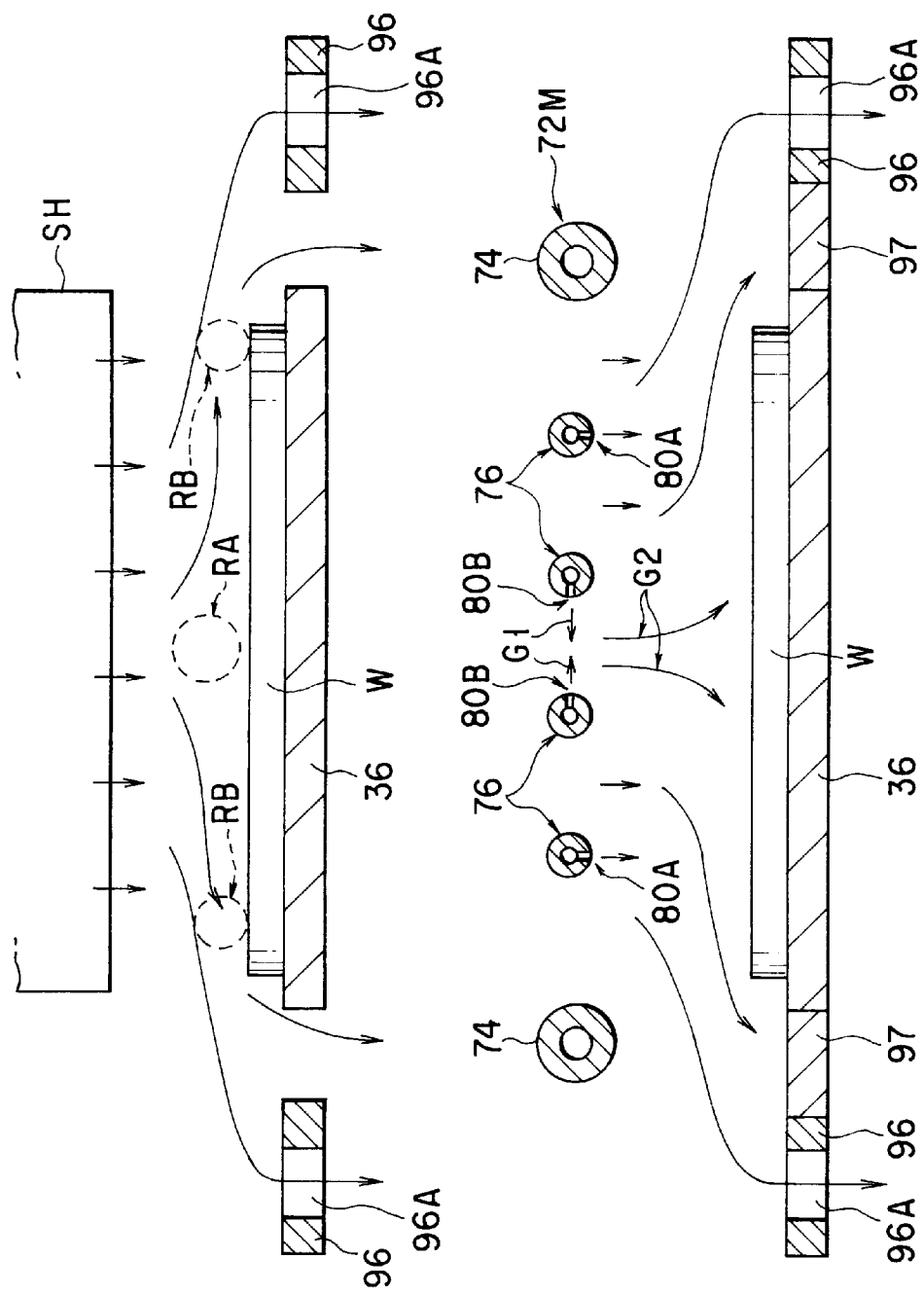
FIGS. 10A and 10B are cross-sectional views showing the flow of a process gas in a conventional apparatus and the apparatus shown in FIG. 7, respectively.

The flow of a process gas in the heat-treating apparatus 22M shown in FIG. 7 and a conventional apparatus will be explained, with reference to FIGS. 10A and 10B. FIGS. 10A and 10B schematically show the flow of a process gas in the conventional apparatus and the apparatus of the present invention, respectively.

As shown in FIG. 10A, in the conventional apparatus, all the process gas is spouted vertically downward from a shower head SH, and flows diagonally downward to gradually spread toward the periphery of a wafer under the influence of vacuum-exhaustion. Consequently, a region surrounded by a broken line RA directly above the center of wafer comes to have a relatively low concentration of the process gas. Further, although most of the process gas diffusing onto the periphery of the wafer flows through holes 96A formed in a rectifying plate 96, some of the process gas flows downward through the gap between a worktable 36 and the rectifying plate 96. Consequently, the process gas flows rapidly and stays for a shorter period of time in a region surrounded by a broken line RB on the periphery of the wafer. As a result, the concentration of the process gas becomes low at the center and the periphery of the wafer, and thus the processed amount at the center and the periphery is lower than that at the intermediate portion of the wafer.

On the other hand, as shown in FIG. 10B, in the apparatus of the present invention, the process gas is partly spouted horizontally toward the center from the spouting holes 80B formed on the central part of the inside pipes 76, as indicated by flows G1, as well as being spouted vertically downward from the inside pipes 76 of the shower head 72M. The flows G1 of the process gas spouted toward the center from opposite parts of the inside pipes 76 hit each other, and form flows G2 flowing vertically downward to be supplied to the center of the wafer.

Accordingly, the structure shown in FIG. 10B does not create the region RA shown in FIG. 10A, having a low concentration of the process gas at the center of the wafer W. The gas of the flows G2 diffusing on the wafer surface toward the periphery is combined with part of the process gas spouted vertically downward from the downward spouting holes 80A, and further flows toward the peripheral edge of the wafer W.

As shown in FIG. 10B, the apparatus of the present invention has the seal ring plate 92 completely sealing the portion between the worktable 36 and the rectifying plate 96. With this arrangement, all the process gas having arrived at the peripheral edge of the wafer W is caused to flow downward through the holes 96A of the rectifying plate 96. Consequently, the flow rate of the process gas on the periphery of the wafer does not increase so much, but is maintained at almost the same as that on the intermediate portion of the wafer.

Accordingly, the structure shown in FIG. 10B does not create the region RB shown in FIG. 10A, where the process gas flows rapidly.

For this reason, according to the heat-treating apparatus 22M shown in FIG. 7, the planar uniformity of a predetermined process, for example, reforming process, can be greatly improved by the synergistic effect of the modified shower head 72M and the seal plate 97. Even where either the shower head 72M or the seal plate 97 is adopted, the planar uniformity of a predetermined process can be improved to some extent.

[Experiment 2]

A comparative experiment was performed between an apparatus of the present invention having the seal plate 97 and the shower head 72 shown in FIG. 3 in place of the shower head 72M shown in FIG. 7, and a conventional apparatus having no seal plate 97. In this experiment, a reforming process on the surface of a wafer was performed, with a setting target thickness of 15 Å. As a result, the variation in the reforming process, using the conventional apparatus, was about ±2 to 3 Å. On the other hand, the variation in the reforming process, using the apparatus of the present invention, was about ±1 Å, thereby confirming improvement in the planar uniformity of the process.

Figure 11:
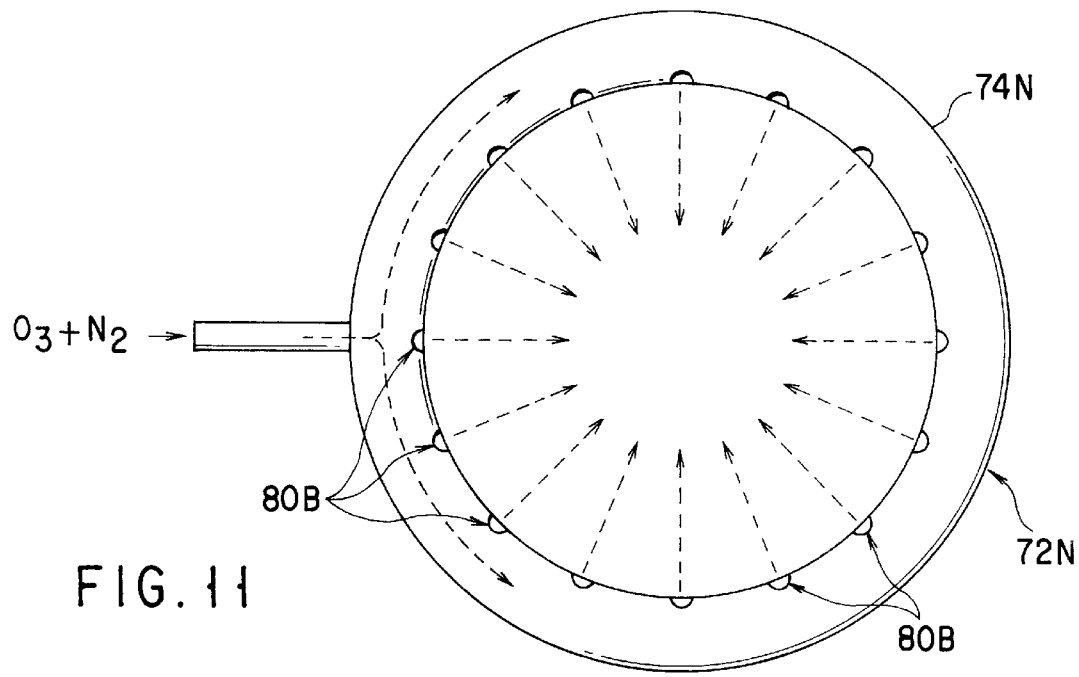
FIG. 11 is a plan view showing a modified shower head.
Figure 12:
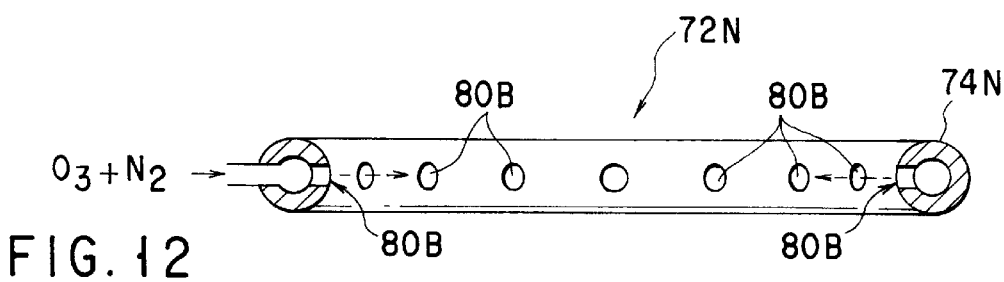
FIG. 12 is a cross-sectional side view showing the shower head shown in FIG. 11.

FIGS. 11 and 12 are a plan view and a cross-sectional side view, respectively, showing a modified shower head 72N.

Each of the shower heads 72 and 72M shown in FIGS. 3 and 9 consists of the outside ring pipe 74 having a relatively large tube-diameter, and the inside pipes 76 having a small tube-diameter and combined to form a lattice. The shower head 72N shown in FIGS. 11 and 12, however, has no inside pipes 76, but consists only of an outside pipe 74N having a ring shape with a diameter substantially the same as that of the worktable 36. The dimensions, such as the ring diameter and the tube diameter, of the outside pipe 74N are set to be almost the same as those of the shower heads 72 and 72M shown in FIGS. 3 and 9. A number of spouting holes 80B are formed on the inside of the outside pipe 74N, for spouting the process gas in a horizontal direction toward the center. The spouting holes 80B are arranged at substantially regular intervals in the angular direction on the ring pipe 74N.

Figure 13:
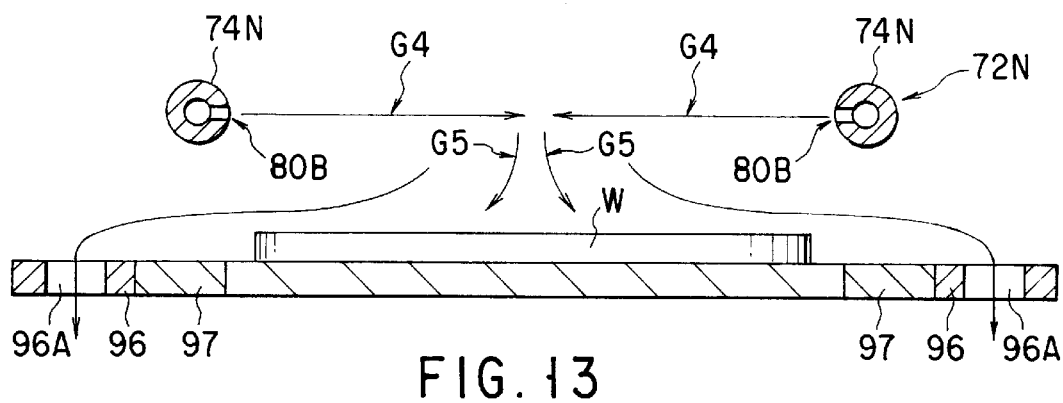
FIG. 13 is a cross-sectional side view showing the flow of a process gas where the shower head shown in FIG. 11 is used.

As shown in FIG. 13, flows G4 of the process gas horizontally spouted toward the process chamber center from the spouting holes 80B collide with each other and become concentrated at the center of the shower head 72N. Since vacuum-exhaustion is carried out at the lower part of the process chamber, the flows G4 of the process gas turns into a flow G5 flowing vertically downward from the process chamber center after the collision, and are supplied to the center of the wafer. Then, the process gas in the flow G5 diffuses to the periphery from the center of the wafer substantially in a radiating manner.

Accordingly, as in the shower head 72M shown in FIG. 9, the shower head 72N does not create the region RA shown in FIG. 10A, having a low concentration of the process gas at the center of the wafer W. Further, since process gas can be passed at substantially the same flow rate over the entire wafer surface, it is possible to improve the planar uniformity of the heat treatment, i.e., reforming process.

The heat-treating apparatuses according to the embodiments of the present invention described with reference to FIGS. 2 to 13 are not limited by wafer sizes, but can be applied to all wafer sizes, such as 6 inches, 8 inches, 12 inches. Further, although these embodiments are explained on a heat-treating apparatus for performing reforming crystallizing processes, the present invention is applicable to all the single-substrate-heat-treating apparatuses, such as a film deposition apparatus, a thermally diffusing apparatus, an annealing apparatus, and an etching apparatus. Furthermore, the target substrate is not limited to a semiconductor wafer, but includes a glass substrate, an LCD substrate, etc.

Figure 14:
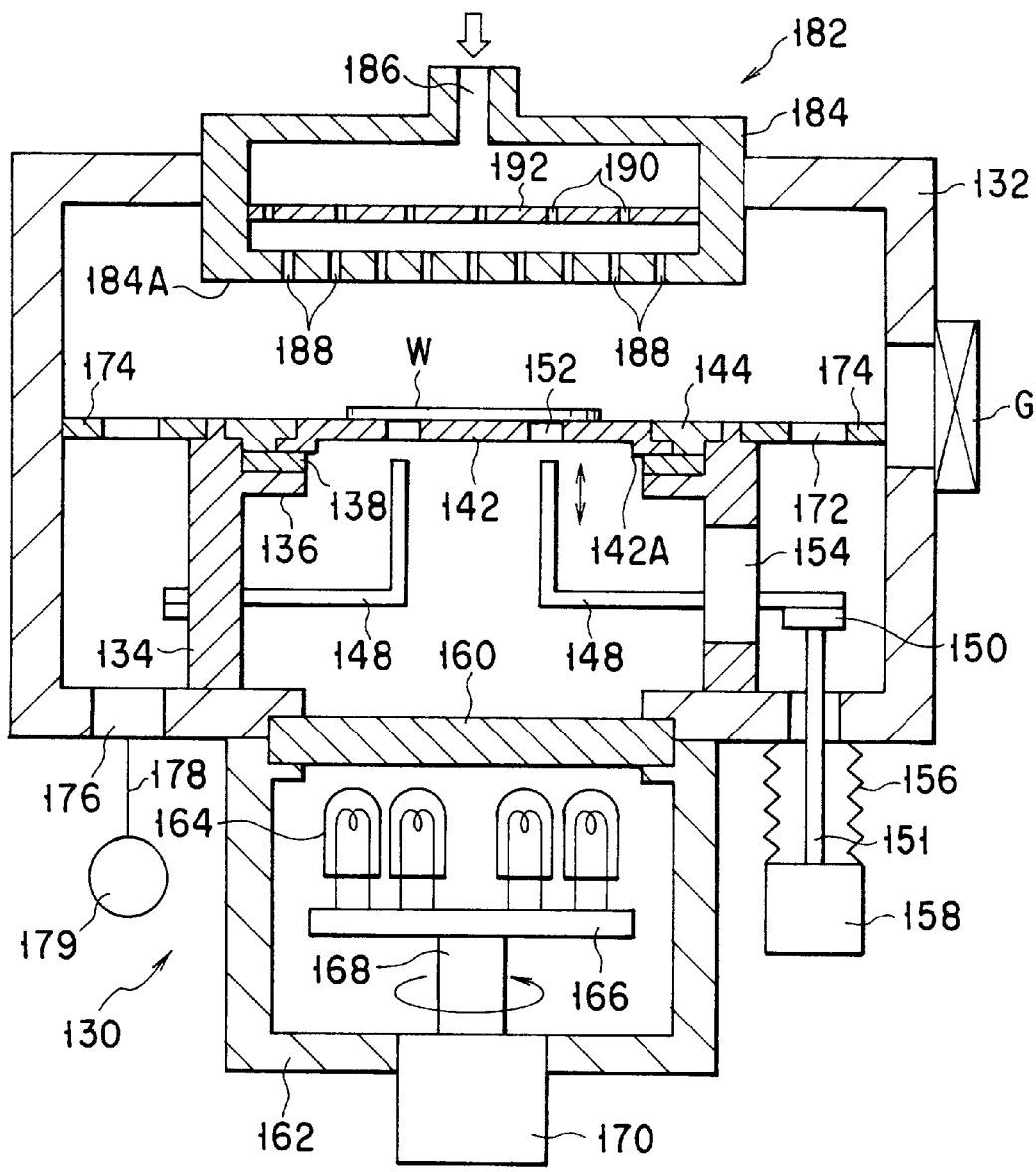
FIG. 14 is a constitutional view schematically showing the main part of a CVD apparatus according to an embodiment of the present invention, which may be used in the film forming system shown in FIG. 1.

FIG. 14 is a constitutional view schematically showing the main part of a CVD apparatus 130 according to an embodiment of the present invention. The apparatus 130 may be used as each of the CVD apparatuses 4 and 6 in the film forming system shown in FIG. 1.

Figure 15:
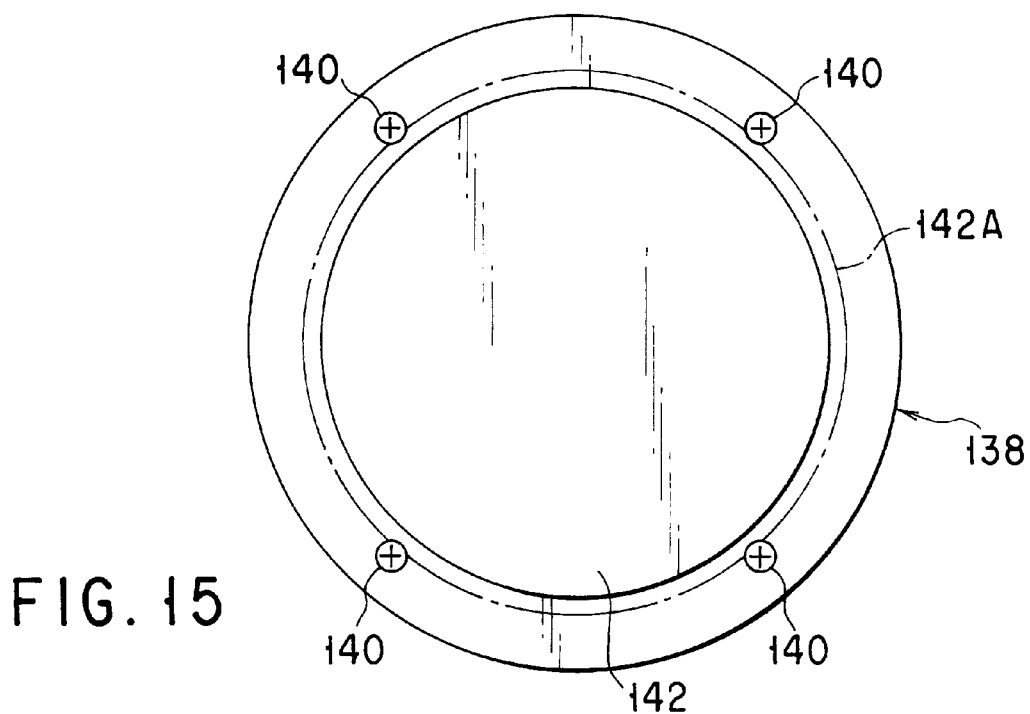
FIG. 15 is a plan view showing a worktable plate, a spacer, and a stopper used in the apparatus shown in FIG. 14.
Figure 17:
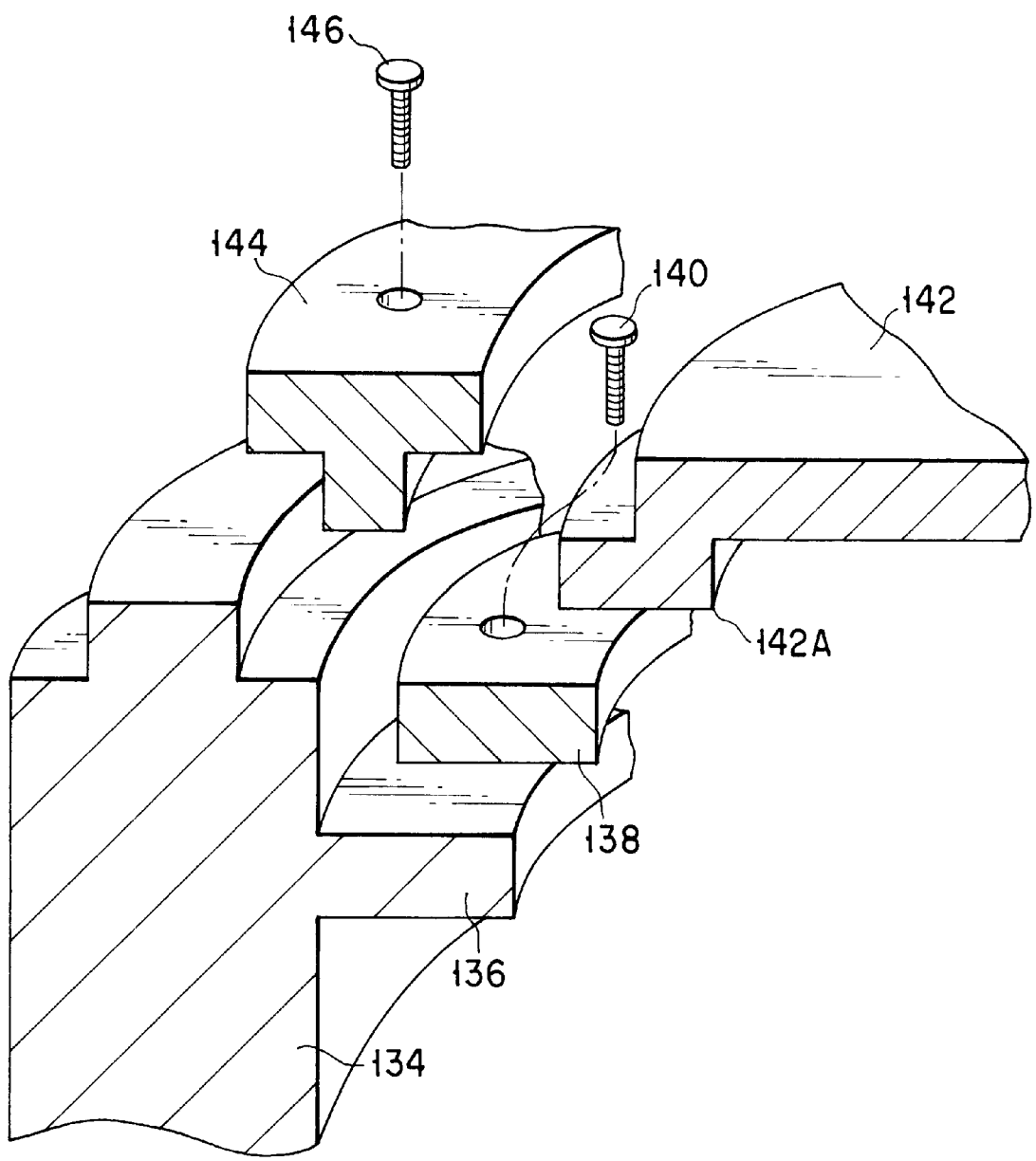
FIG. 17 is a cross-sectional perspective view showing the hollow column, the worktable plate, the spacer, and the clamping member used in the apparatus shown in FIG. 14.

As shown in FIG. 14, the CVD apparatus 130 includes a process chamber 132 made of aluminum in the shape of a cylinder or box. In the process chamber 132, the cylinder-like hollow column 134 is arranged to stand up from the process chamber bottom. The hollow column 134 is made of a corrosion-resistant material, such as aluminum. A shelf portion 136 having a ring shape is formed at an upper position on the inner wall of the cylindrical hollow column 134 to project slightly inward, e.g., only about 10 mm. A spacer 138 having a ring shape with the same width as the shelf portion 136 is mounted on the shelf portion 136, and is fixed to the shelf portion 136 with screws 140 (see FIGS. 15 and 17).

The spacer 138 is made of a corrosion-resistant material, such as stainless steel. However, it is not limited to this, but as for the material of a spacer 138, any material may be used as long as it is corrosion-resistant and has less possibility to cause contamination with metals.

A circular worktable plate 142 is mounted on top of the spacer 138 while its periphery is in contact with the inner periphery of the upper surface of the spacer 138. Specifically, a leg portion 142A having a ring shape in the plan view and substantially an L shape in the cross-sectional view is formed at the periphery of the worktable plate 142. The leg portion 142A is mounted on the spacer 138 so that the whole of the worktable plate 142 is supported. The worktable plate 142 is made of SiC and has a thickness of, e.g., about 3 to 4 mm. The diameter of the worktable plate 142 changes in accordance with the size of a target substrate, i.e., the semiconductor wafer W, mounted on the worktable plate 142. For example, when processing an 8 inch wafer, the diameter of the worktable plate 142 is set at about 24 cm.

A stopper 144 having a ring shape in the plan view and a substantially T shape downward projection in the cross-sectional view is inserted between the periphery of the worktable plate 142 and the top of the hollow column 134. The stopper 144 is fixed to the shelf portion 136 with screws 146 (see FIG. 17), whereby, the whole of the worktable plate 142 is fixed to a predetermined position. The stopper 144 is made of a material the same as that of the worktable plate 14, i.e., SiC, in this embodiment. The stopper 144 has a thickness such that its upper surface is level with the upper surface of the worktable plate 142.

Underneath the worktable plate 142, a plurality of, e.g., three, L-shape lifter pins 148 (only two of them are shown in FIG. 14) are arranged so that they stand upward. The lifter pins 148 are made of a material which allows heat rays to pass through, such as quartz. The base portions of the lifter pins 148 are connected through a ring-shape connecting member 150 to an elevating rod 151 which penetrates the process chamber bottom. By moving the elevating rod 151 up and down, the lifter pins 148 project and retreat through holes 152 formed in the worktable plate 142. Specifically, the wafer W is moved up and down by the lifter pins 148 when the wafer W is transferred onto and from the worktable plate 142. Long holes 154 for allowing the lifter pins 148 to penetrate therethrough and move up and down are partly formed in the hollow column 134.

The lower end of the elevating rod 151 is connected to an actuator 158. Between the bottom of the process chamber 132 and the actuator 158, the elevating rod 151 is airtightly surrounded by a bellows 156 which can be expanded and contracted. With the bellows, the airtightness in the process chamber 132 is ensured.

A window 160 made of a heat-ray-transmitting material, such as quartz, is airtightly arranged at the process chamber bottom directly under the worktable plate 142. Underneath the window 160, the box-like heating room 162 is arranged to surround the window 160. In the heating room 162, two or more heating lamps 164 used as heating means are attached to a rotation stand 166. The upper surface of the rotation stand 166 is formed as a reflective mirror surface. The rotation stand 166 is rotated through a rotation shaft 168 by a rotation motor 170 arranged at the bottom of the heating room 162. Heat rays emitted from the heating lamps 164 are transmitted through the window 160, and are incident onto the bottom surface of the worktable plate 147 to heat it.

Between the upper end of the hollow column 134, and the inner wall of the process chamber, a ring-like rectifying plate 174 provided with a number of through holes 172 is arranged to surround the worktable plate 142. A plurality of exhaust ports 176 are formed in the bottom of the process chamber 132 under the rectifying plate 174. The exhaust ports 176 are connected through the exhaust line 178 to a vacuum exhaust mechanism 179 having a vacuum pump, so that the inside of the process chamber 132 can be exhausted and set at a vacuum. A gate valve G is arranged on the side wall of the process chamber 132, so that it is opened and closed when the wafer is transferred into and out of the process chamber.

A shower head 182 is arranged on the ceiling of the process chamber 132 to face the worktable plate 142, for introducing process gas into the process chamber 132. Specifically, the shower head 182 has a head body 184 formed of, e.g., a circular aluminum box. A gas introduction port 186 is arranged at the top of the head body 184 for introducing the process gas which has been subjected to a flow control.

A distribution plate 192 having a number of distribution holes 190 is arranged in the head body 184. A number of gas spouting holes 188 are formed substantially all over a gas spouting face 184A which is the bottom surface of the head body 184. The process gas supplied into the head body 184 is uniformly supplied toward the wafer surface from the gas spouting holes 188.

An explanation will be given to a CVD method, using the apparatus shown in FIG. 14.

At first, the gate valve G on the side wall of the process chamber 132 is opened, and a semiconductor wafer W is transferred from the common transfer chamber 3 into the process chamber 132 by the arm mechanism 16 (see FIG. 1). The lifter pins 148 are moved up by the elevating rod 151 to receive the wafer W by the lifter pins 148. Then, the lifter pins 148 are moved down by the elevating rod 151 to mount the wafer onto the worktable plate 142.

Predetermined amounts of a He bubbling gas of a metal alkoxide, such as $Ta(OC_2H_5)_5$, used as a film-deposition gas, and $O_2$ gas are supplied from process gas sources (not shown) to the shower head 182, and mixed with each other therein. The mixed process gas thus formed is uniformly spouted from the spouting holes 188 on the bottom surface of the head body 184 into the process chamber 132. At the same time, the process chamber is vacuum-exhausted from the exhaust port 176 and is set at a vacuum of, e.g., from about 0.2 to 0.3 Torr.

The heating lamps 164 in the heating room 162 are driven to rotate and emit heat energy. The emitted heat rays are transmitted through the window 160 and radiated onto the bottom surface of the worktable plate 142 to heat it. Since the worktable plate 142 is as thin as about several millimeters, it can be heated up quickly, and thus the wafer W mounted thereon is also heated quickly to a predetermined temperature. The supplied mixed gas causes a certain chemical reaction to deposit, e.g., a tantalum oxide film on the wafer surface. This process is performed at a predetermined temperature of, e.g., from 250 to 450° C.

Figure 16:
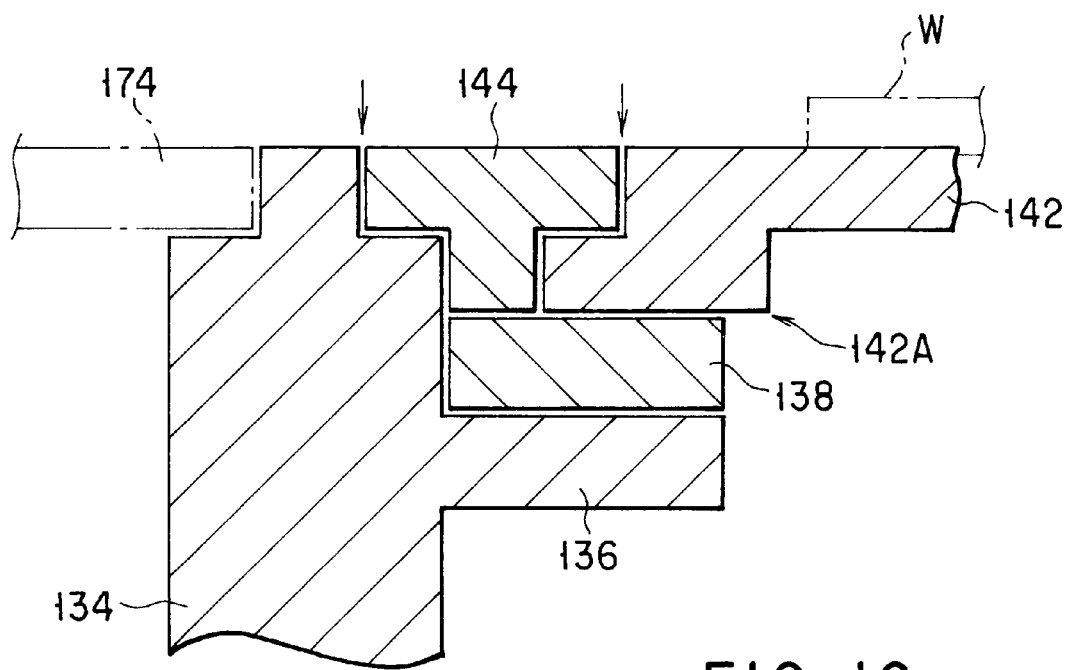
FIG. 16 is a cross-sectional side view showing a hollow column, the worktable plate, the spacer, and the stopper used in the apparatus shown in FIG. 14.

In a conventional apparatus, a film-deposition gas tends to enter the bottom side of a worktable plate and to allow an unnecessary film to be deposited on the worktable plate. However, in the present invention, as shown in FIGS. 14 and 16, the leg portion 142A of the worktable plate 142 is placed on the shelf portion 136 with the ring-like spacer 138 interposed therebetween. Further, the leg portion 142A is pressed and fixed by the ring-like stopper 144, using the screws 146. Consequently, the outer surfaces of the members 138, 142, and 144 are brought into very close contact with each other. In other words, there is little gap formed between the members 138, 142, and 144, so that all the gas leakage passages from the process field to the backside of the worktable plate 142 are substantially completely shut off. As a result, it is possible to prevent the process gas from entering the backside of the worktable plate 142 and to prevent an unnecessary film obstructing heat rays from being deposited on the bottom surface of the worktable plate 142.

As described above, since substantially no unnecessary films are deposited on the bottom surface of the worktable plate 142, the wafer can be efficiently heated without any temperature distribution on the wafer. Consequently, the wafer temperature maintains a high planar uniformity, so that a predetermined process, i.e., CVD process, can have an improved planer uniformity.

[Experiment 3]

A comparative experiment was performed between the CVD apparatus shown in FIG. 14, and a conventional CVD apparatus having no spacer 138 nor stopper 144, under the same conditions of a film-deposition process. As a result, in the conventional apparatus, an unnecessary film was deposited on the bottom side of the worktable after the lapse of a certain process time. On the other hand, in the apparatus of the present invention, almost no unnecessary film was deposited on the bottom side of the worktable 142. It was confirmed that the apparatus of the present invention had better characteristics.

The heat CVD apparatuses according to the embodiments of the present invention described with reference to FIGS. 14 to 17 are not limited by wafer sizes, but can be applied to all wafer sizes, such as 6 inches, 8 inches, 12 inches. Further, although these embodiments are explained in a case where the tantalum oxide film, i.e., a metal oxide film, is deposited, the present invention is applicable to a process of depositing another metal oxide film of, e.g., titanium oxide, zirconium oxide, barium oxide, or strontium oxide, or an insulating film of, e.g., $SiO_2$ or SiOx. Furthermore, the target substrate is not limited to a semiconductor wafer, but includes a glass substrate, an LCD substrate, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single-substrate-heat-treating apparatus for a semiconductor process system, comprising:
   an airtight process chamber;
   a worktable arranged within said process chamber and having a top surface configured to place a target substrate thereon;
   an exhaust mechanism configured to exhaust said process chamber;
   a supply mechanism configured to supply a process gas into said process chamber; and
   a heating mechanism configured to heat said target substrate placed on said worktable;
   wherein said supply mechanism comprises a shower head including an outside pipe having a ring shape with a diameter larger than a diameter of said target substrate, and inside pipes connected to an inside of said outside pipe and combined to form a lattice, and wherein said inside pipes are provided with first spurting holes for spouting said process gas downward, in a first direction toward the target substrate, and part of said inside pipes defining a central opening of said shower head are provided with second spurting holes for spouting said process gas inward in a second direction perpendicular to the first direction, such that flows of the process gas spouted from said second spurting holes hit each other and form flows flowing downward in the first direction to be supplied to a center of the target substrate.

2. The apparatus according to claim 1, further comprising a rectifying plate arranged to partition an inner space of said process chamber and provided with through holes, and a seal plate forming an airtight seal between said worktable and said rectifying plate.

3. The apparatus according to claim 1, wherein said process gas contains oxygen atoms to perform a reforming process for removing organic impurities contained in a thin film arranged on said target substrate.

4. The apparatus according to claim 3, further comprising an exciting mechanism configured to excite said process gas so as to generate active oxygen atoms to be supplied to said thin film.

5. The apparatus according to claim 4, wherein said exciting mechanism includes an ultraviolet source arranged above said shower head and outside said process chamber to irradiate said process gas with ultraviolet rays within said process chamber, and said inside pipes consist essentially of a material transparent to ultraviolet rays.

* * * * *